US010629561B2

(12) United States Patent
Zhao et al.

(10) Patent No.: US 10,629,561 B2
(45) Date of Patent: Apr. 21, 2020

(54) OVERLAPPING STACKED DIE PACKAGE WITH VERTICAL COLUMNS

(71) Applicant: Intel Corporation, Santa Clara, CA (US)

(72) Inventors: Junfeng Zhao, Shanghai (CN); Cheng Yang, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/282,824

(22) Filed: Feb. 22, 2019

(65) Prior Publication Data

US 2019/0189585 A1 Jun. 20, 2019

Related U.S. Application Data

(63) Continuation of application No. 15/509,416, filed as application No. PCT/CN2014/088096 on Oct. 3, 2014, now Pat. No. 10,256,208.

(51) Int. Cl.
*H01L 23/00* (2006.01)
*H01L 25/00* (2006.01)
(Continued)

(52) U.S. Cl.
CPC ............ *H01L 24/45* (2013.01); *H01L 24/08* (2013.01); *H01L 24/19* (2013.01); *H01L 24/20* (2013.01);
(Continued)

(58) Field of Classification Search
CPC ......... H01L 24/45; H01L 24/08; H01L 24/19; H01L 24/20; H01L 24/85; H01L 24/96;
(Continued)

(56) References Cited

U.S. PATENT DOCUMENTS 5,061,989 A 10/1991 Yen
6,348,728 B1 2/2002 Aiba et al.
(Continued)

FOREIGN PATENT DOCUMENTS

CN 102790042 A 11/2012
CN 103165484 A 6/2013
(Continued)

OTHER PUBLICATIONS

"European Application Serial No. 14883533.3, Communication Pursuant to Article 94(3) EPC dated May 27, 2019", 9 pgs.
(Continued)

*Primary Examiner* — Thinh T Nguyen
(74) *Attorney, Agent, or Firm* — Schwegman Lundberg & Woessner, P.A.

(57) ABSTRACT

Some forms relate to an electronic assembly that includes a die that includes an upper surface and a conductive column extending from the upper surface such that the conductive column is not surrounded by any material other than where the conductive column engages the die. Other forms relate to an electronic package that includes a stack of electronic assemblies where each electronic assembly includes a die that having an upper surface and a plurality of conductive columns extending from the upper surface such that each conductive column is not surrounded by any material other than where the conductive column engages the die, and wherein the stack of electronic assemblies is arranged in an overlapping configuration such the plurality of conductive columns on each electronic assembly are not covered by another electronic assembly.

6 Claims, 12 Drawing Sheets

(51) Int. Cl.
*H01L 25/10* (2006.01)
*H01L 25/065* (2006.01)
*H01L 23/31* (2006.01)

(52) U.S. Cl.
CPC ............. *H01L 24/85* (2013.01); *H01L 24/96* (2013.01); *H01L 25/0657* (2013.01); *H01L 25/105* (2013.01); *H01L 25/50* (2013.01); *H01L 23/3128* (2013.01); *H01L 24/32* (2013.01); *H01L 24/73* (2013.01); *H01L 24/92* (2013.01); *H01L 2224/06135* (2013.01); *H01L 2224/12105* (2013.01); *H01L 2224/214* (2013.01); *H01L 2224/32145* (2013.01); *H01L 2224/73217* (2013.01); *H01L 2224/73267* (2013.01); *H01L 2224/92244* (2013.01); *H01L 2225/06506* (2013.01); *H01L 2225/06562* (2013.01); *H01L 2225/1035* (2013.01); *H01L 2225/1058* (2013.01); *H01L 2924/181* (2013.01); *H01L 2924/18162* (2013.01)

(58) Field of Classification Search
CPC ........... H01L 23/3128; H01L 2224/214; H01L 2924/181
USPC ........ 257/734, 737, 686, 719, 723; 438/107, 438/109, 613
See application file for complete search history.

(56) References Cited

U.S. PATENT DOCUMENTS

| | | |
|---|---|---|
| 7,656,017 B2 | 2/2010 | Kim et al. |
| 8,637,984 B2 | 1/2014 | Schuetz |
| 8,664,757 B2 | 3/2014 | Cho |
| 10,256,208 B2 | 4/2019 | Zhao et al. |
| 2003/0156402 A1 | 8/2003 | Ding et al. |
| 2004/0004294 A1 | 1/2004 | Hall et al. |
| 2006/0125072 A1 | 6/2006 | Mihara |
| 2006/0138647 A1 | 6/2006 | Crisp et al. |
| 2007/0148918 A1 | 6/2007 | Kinsman et al. |
| 2008/0142943 A1 | 6/2008 | Kim et al. |
| 2008/0164605 A1 | 7/2008 | Wu |
| 2010/0193930 A1* | 8/2010 | Lee ..................... H01L 23/5389 257/686 |
| 2011/0068427 A1 | 3/2011 | Paek et al. |
| 2011/0298128 A1* | 12/2011 | Schuetz ............. H01L 21/4853 257/738 |
| 2013/0127041 A1 | 5/2013 | Goh |
| 2014/0054760 A1 | 2/2014 | Yu et al. |
| 2014/0141566 A1 | 5/2014 | Schuetz et al. |
| 2017/0278821 A1 | 9/2017 | Zhao et al. |

FOREIGN PATENT DOCUMENTS

| | | |
|---|---|---|
| CN | 105830212 A | 8/2016 |
| JP | 2006173232 A | 6/2006 |
| JP | 2012248598 A | 12/2012 |
| JP | 2015533258 A | 11/2015 |
| KR | 1020060102884 A | 9/2006 |
| KR | 1020120006352 A | 1/2012 |
| KR | 1020130129165 A | 11/2013 |
| TW | 200504902 A | 2/2005 |
| TW | 200830520 A | 7/2008 |
| TW | 201044556 A | 12/2010 |
| TW | 201405683 A | 2/2014 |
| TW | 201436138 A | 9/2014 |
| TW | 201626522 A | 7/2016 |
| TW | I578466 B | 4/2017 |
| WO | WO-2009022991 A1 | 2/2009 |
| WO | WO-2010041356 A1 | 4/2010 |
| WO | WO-2013052441 A2 | 4/2013 |
| WO | WO-2014014643 A1 | 1/2014 |
| WO | WO-2016049940 A1 | 4/2016 |

OTHER PUBLICATIONS

"U.S. Appl. No. 15/509,416, Examiner Interview Summary dated Jul. 20, 2018", 3 pgs.
"U.S. Appl. No. 15/509,416, Non Final Office Action dated Jun. 29, 2018", 14 pgs.
"U.S. Appl. No. 15/509,416, Notice of Allowance dated Nov. 20, 2018", 8 pgs.
"U.S. Appl. No. 15/509,416, Response filed Jan. 24, 2018 to Restriction Requirement dated Jan. 3, 2018", 7 pgs.
"U.S. Appl. No. 15/509,416, Response filed May 8, 2018 to Restriction Requirment dated Apr. 16, 2018", 7 pgs.
"U.S. Appl. No. 15/509,416, Response Filed Jul. 17, 2018 to Non Final Office Action dated Jun. 29, 2018", 5 pgs.
"U.S. Appl. No. 15/509,416, Restriction Requirement dated Jan. 3, 2018", 11 pgs.
"U.S. Appl. No. 15/509,416, Restriction Requirement dated Apr. 16, 2018", 6 pgs.
"Chinese Application Serial No. 201480008902.8, Decision of Rejection dated Oct. 11, 2018", w/English Translation, 17 pgs.
"Chinese Application Serial No. 201480008902.8, Office Action dated Jan. 31, 2018", w/ English translation, 22 pgs.
"Chinese Application Serial No. 201480008902.8, Response filed Jun. 13, 2018 to Office Action dated Jan. 31, 2018", w/ English current claims, 11 pgs.
"European Application Serial No. 14883533.3, Extended European Search Report dated Jan. 30, 2017", 13 pgs.
"International Application Serial No. PCT/CN2014/088096, International Search Report dated Jun. 12, 2015", 5 pgs.
"International Application Serial No. PCT/CN2014/088096, Written Opinion dated Jun. 12, 2015", 6 pgs.
"Japanese Application Serial No. 2016-550918, Examiners Decision of Final Refusal dated Apr. 3, 2018", w/ English Translation, 6 pgs.
"Japanese Application Serial No. 2016-550918, Office Action dated Aug. 8, 2017", With English Translation, 7 pgs.
"Japanese Application Serial No. 2016-550918, Office Action dated Nov. 29, 2016", w/ English Translation, 7 pgs.
"Japanese Application Serial No. 2016-550918, Response filed Feb. 23, 2017 to Office Action dated Nov. 29, 2016", w/ claims in English, 11 pgs.
"Japanese Application Serial No. 2016-550918, Response filed Nov. 2, 2017 to Office Action dated Aug. 8, 2017", w/ claims in English, 17 pgs.
"Korean Application Serial No. 2015-7023974, Final Office Action dated Feb. 28, 2017", W/ English Translation, 7 pgs.
"Korean Application Serial No. 2015-7023974, Final Office Action dated May 1, 2017", With English Translation, 6 pgs.
"Korean Application Serial No. 2015-7023974, Office Action dated Aug. 24, 2016", (With English Translation), 12 pgs.
"Korean Application Serial No. 2015-7023974, Request for Reexamination filed Apr. 3, 2017 to Final Office Action dated Feb. 28, 2017", w/ claims in English, 24 pgs.
"Korean Application Serial No. 2015-7023974, Response filed Oct. 24, 2016 to Office Action dated Aug. 24, 2016", 30 pgs.
"Taiwanese Application Serial No. 104128814, Office Action dated Aug. 16, 2016", (English Translation), 5 pgs.
"Taiwanese Application Serial No. 104128814, Response filed Nov. 15, 2016 to Office Action dated Aug. 16, 2016", With English Translation of Claims, 15 pgs.
"European Application Serial No. 14883533.3, Response filed Nov. 28, 2019 to Communication Pursuant to Article 94(3) EPC dated May 27, 2019", 8 pgs.

* cited by examiner

OVERLAPPING STACKED DIE PACKAGE WITH VERTICAL COLUMNS

CROSS-REFERENCE TO RELATED APPLICATION

This application is a continuation of U.S. patent application Ser. No. 15/509,416, which is a U.S. National Stage Filing under 35 U.S.C. 371 from International Application No. PCT/CN2014/088096, filed on 3 Oct. 2014, and published as WO 2016/049940 A1 on 7 Apr. 2016, which application is incorporated herein by reference in its entirety.

TECHNICAL FIELD

Embodiments described herein generally relate to stacked die packages, and more particularly to overlapping stacked die packages that include conductive columns.

BACKGROUND

Mobile products (e.g., mobile phones, smart phones, tablet computers, etc.) are very restricted in available space because there are typically severe limitations for chip/package area and height (among other physical and electrical parameters). Therefore, it is extremely important to reduce the size of electronic components (e.g., packaged chips or discrete devices, integrated passive devices (IPDs), surface mount devices (SMDs), etc.) on a system board (e.g., printed circuit board PCB).

Conventional stacked electronic components typically require relatively large z-height making them more difficult to fit inside a housing of mobile products, especially when several chips, IPDs or SMDs need to be assembled and/or stacked one on top of another. In addition, as with most electronic components, there is usually the goal of increased electrical performance.

There are two existing packaging methods for high die count stacked die packages. One method forms a wire bond based package in which substrate and over mold add extra z-height to the package. In addition, wire bond based package are also typically limited in their performance because of the number and length of the wires that are utilized in the packages.

Another existing packaging method for high die count stacked die packages utilizes Thru Silicon Via (TSV) technology. High die count stacked die packages that utilize TSV usually have relatively high speed. However, z-height reduction is still difficult with TSV. In addition, the vias that are formed using TSV technology often use up valuable space on silicon. There are also usually relatively high manufacturing costs that are associated with utilizing TSV technology making it more expensive to produce high die count stacked die packages using TSV technology. The typical z-height of a conventional 16 Die BGA stacked die package is 1.35 mm where each die is thinned to 35 um.

DESCRIPTION OF EMBODIMENTS

Figure 1:
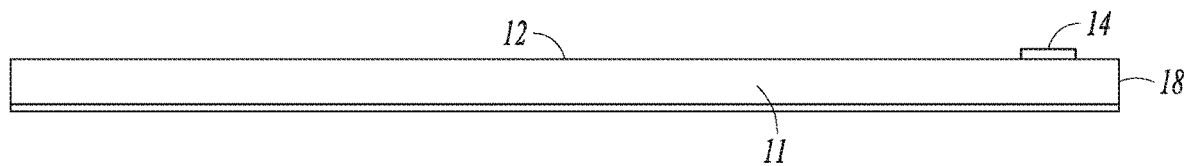
FIG. 1 is a side view of an example die.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The electronic assemblies, packages and methods described herein may address the drawbacks that are associated with using wire bond packaging technology and TSV technology to form high die count stacked die packages. In addition, electronic assemblies, packages and methods described herein may increase the electrical performance of high die count stacked die packages.

The electronic assemblies, packages and methods described herein may provide some benefits over using conventional TSV technology to form high die count stacked die packages.

First, smaller die to die standoff/space may be achieved. Conventional TSV technology usually creates a standoff that is tens of microns, while the assemblies, packages and methods described herein may create a standoff that is 5 um and less. This smaller standoff may reduce the overall size and thickness of the high die count stacked die packages.

Second, the silicon utilization efficiency of the electronic assemblies, packages and methods described herein may be higher than TSV technology because TSV technology must fabricate the vias through peripheral areas of silicon. This need to fabricate openings in the silicon to create openings for via formation (i) uses valuable space on the silicon; and (ii) increases the fabrication costs associated with forming high die count stacked die packages. The electronic assemblies, packages and methods described herein do not require any type of fabrication to create openings in the silicon for vias.

Finally, the electronic assemblies, packages and methods described herein may utilize existing wire bond equipment to create conductive columns on an upper surface of a die. This ability to potentially use existing wire bond equipment may reduce the costs that are associated with fabricating the electronic assemblies, packages and methods described herein.

The electronic assemblies, packages and methods described herein may provide some benefits over using conventional substrate based wire bond technology.

First, the electronic assemblies, packages and methods described herein may provide improved electrical performance. The electrical performance may be better because the conductive columns are shorter than the wires that are used in conventional wire bond technology.

Second, the overall size of the electronic assemblies, packages and methods described herein may be much smaller than substrate based package that utilize conventional wire bond technology. The overall size may be reduced because (i) the X-Y space on the substrate that is usually required for wire bonding may be saved; (ii) the extra over molding that is usually required for the conductive wires that are used in wire bonding may be eliminated to reduce the z-height; and (iii) a substrate is not required because no wire bonding is necessary.

Figure 2:
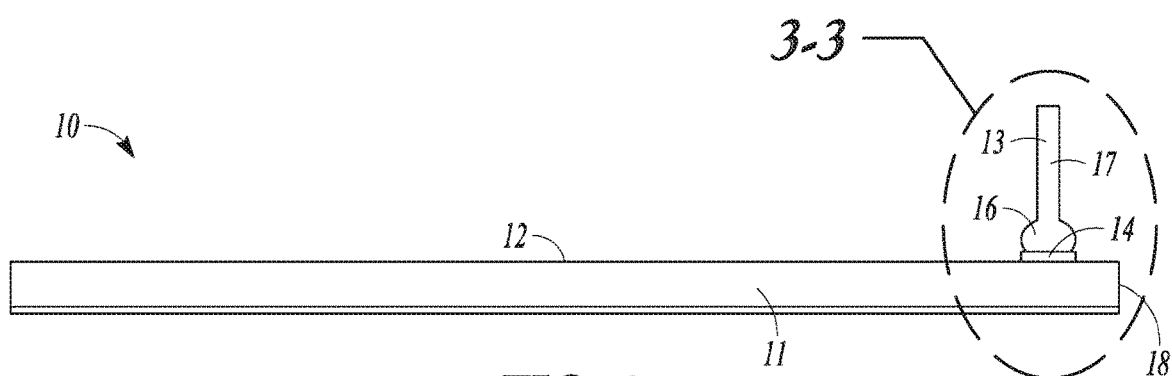
FIG. 2 is a side view of the example die shown in FIG. 1 with at least one conductive column formed on the die.
Figure 3:
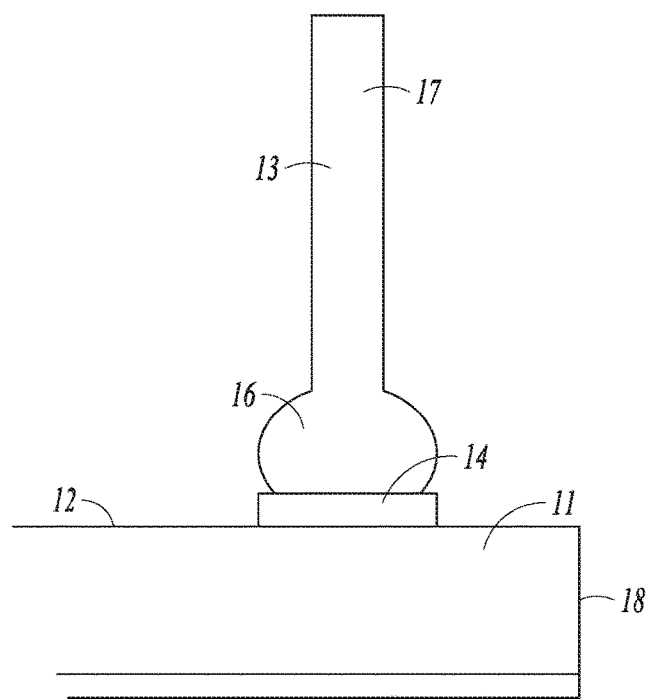
FIG. 3 is an enlarged side view of the conductive column shown in FIG. 2.

FIG. 1 is a side view of an example die 11 while FIG. 2 is a side view of the example die 11 shown in FIG. 1 with at least one conductive column 13 formed on the die 11 to create an electronic assembly 10. FIG. 3 is an enlarged side view of the conductive column 13 shown in FIG. 2 while FIG. 4 is a top view of the electronic assembly 10 shown in FIG. 2.

Figure 4:
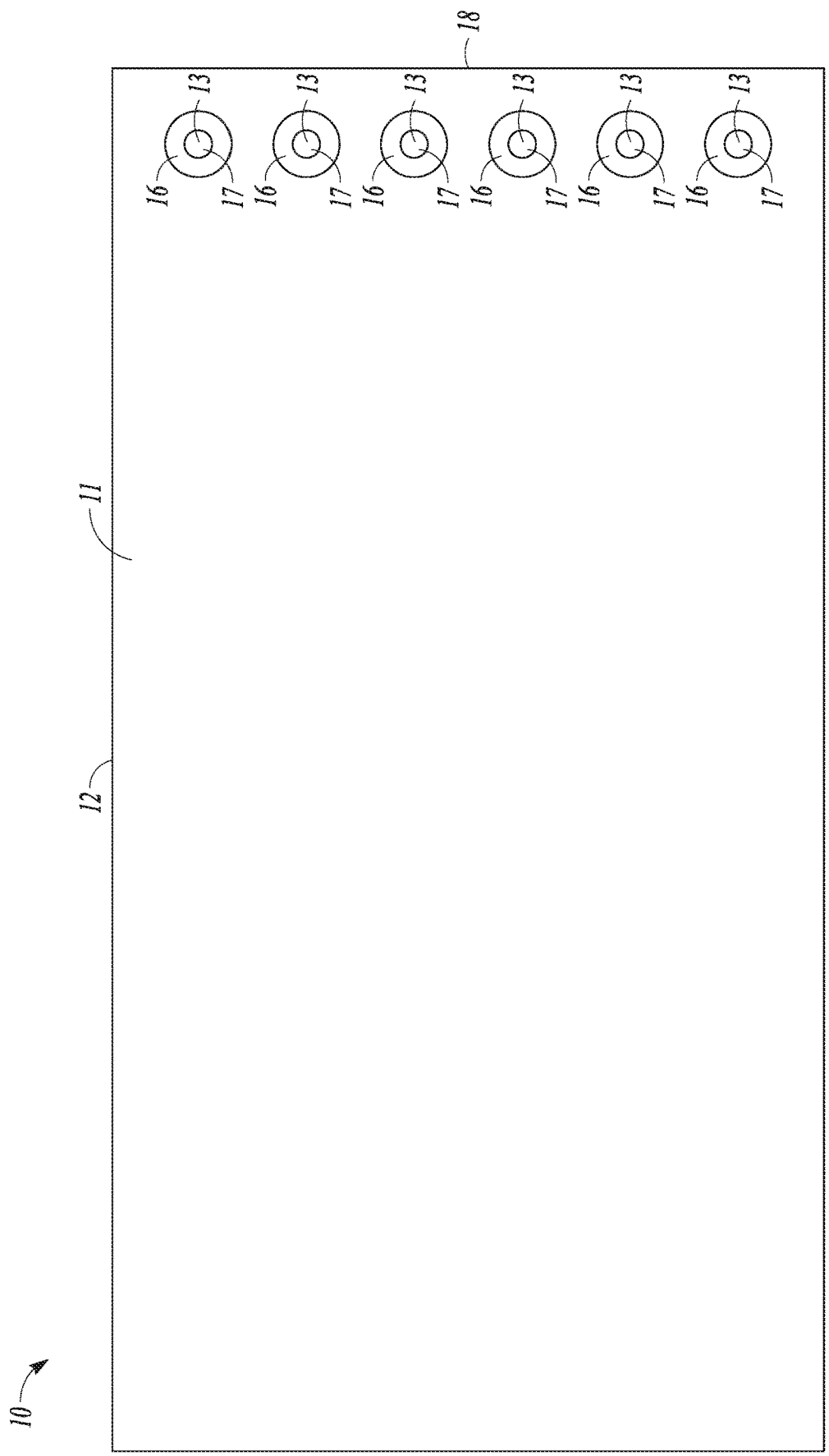
FIG. 4 is a top view of the die shown in FIG. 2.

FIGS. 2-4 illustrate an electronic assembly 10 that includes a die 11 (or some other form of electronic component) having an upper surface 12. The electronic assembly 10 further includes a conductive column 13 that extends from the upper surface 12 such that the conductive column 13 is not surrounded by any material other than where the conductive column 13 engages the die 11.

As an example, the conductive column 13 may be several hundred um long. It should be noted the conductive columns 13 may not have as high of an aspect ratio as shown in the FIGS. (i.e., the conductive columns 13 are not drawn to scale). An example range for the aspect ratio of the conductive columns 13 would be from 1 to 20.

In the example electronic assembly 10 that is shown in FIGS. 2-4, the die 11 includes a conductive pad 14 such that the conductive column 13 extends from the conductive pad 14 on the die 11. It should be noted that the conductive pad 14 shown in FIGS. 1-4 is merely an example of a conductor that may be included on the upper surface 12 of the die 11 for engagement with the conductive column 13.

In addition, the conductive column 13 may include a spherical section 16 that engages the conductive pad 14 and a cylindrical section 17 that extends from the spherical section 16. It should be noted that other forms are contemplated for the conductive column 13. The configuration and size of the conductive column 13 will depend in part on the overall design of the electronic assembly 10 as well as manufacturing considerations that are associated with fabricating the conductive columns 13 (among other factors).

As shown in FIG. 4, the conductive column 13 may be part of a plurality of conductive columns 13 extending from the upper surface 12 such that each conductive column 13 is not surrounded by any material other than where the conductive columns 13 engage the die 11. In the example electronic assembly 10 that is shown in FIG. 4, the plurality of conductive columns 13 are aligned in a row near one edge 18 of the die 11.

It should be noted that the plurality of conductive columns 13 may be arranged in any manner on the upper surface 12 of the die 11. As examples, the plurality of conductive columns 13 may be arranged in an L-shaped, C-shaped, or multiple row configuration on the upper surface 12 of the die 11. The arrangement of the plurality of conductive columns 13 on the upper surface 12 of the die 11 will depend in part on the overall design of the electronic assembly 10 as well as manufacturing consideration that are associated with fabricating the electronic assembly 10 (among other factors).

Figure 5:
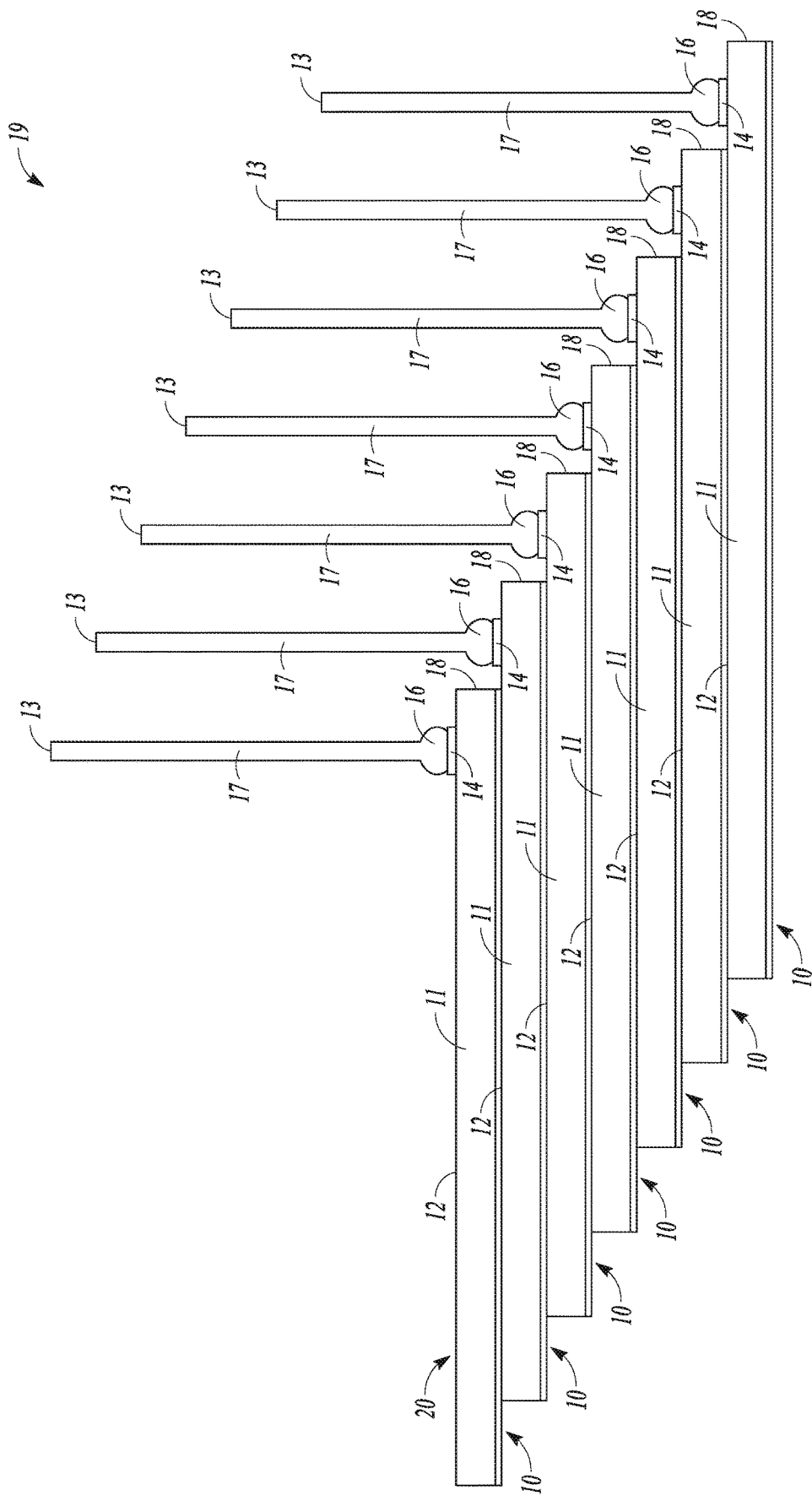
FIG. 5 is a side view of a package that includes an overlapping stack of electronic assemblies.
Figure 6:
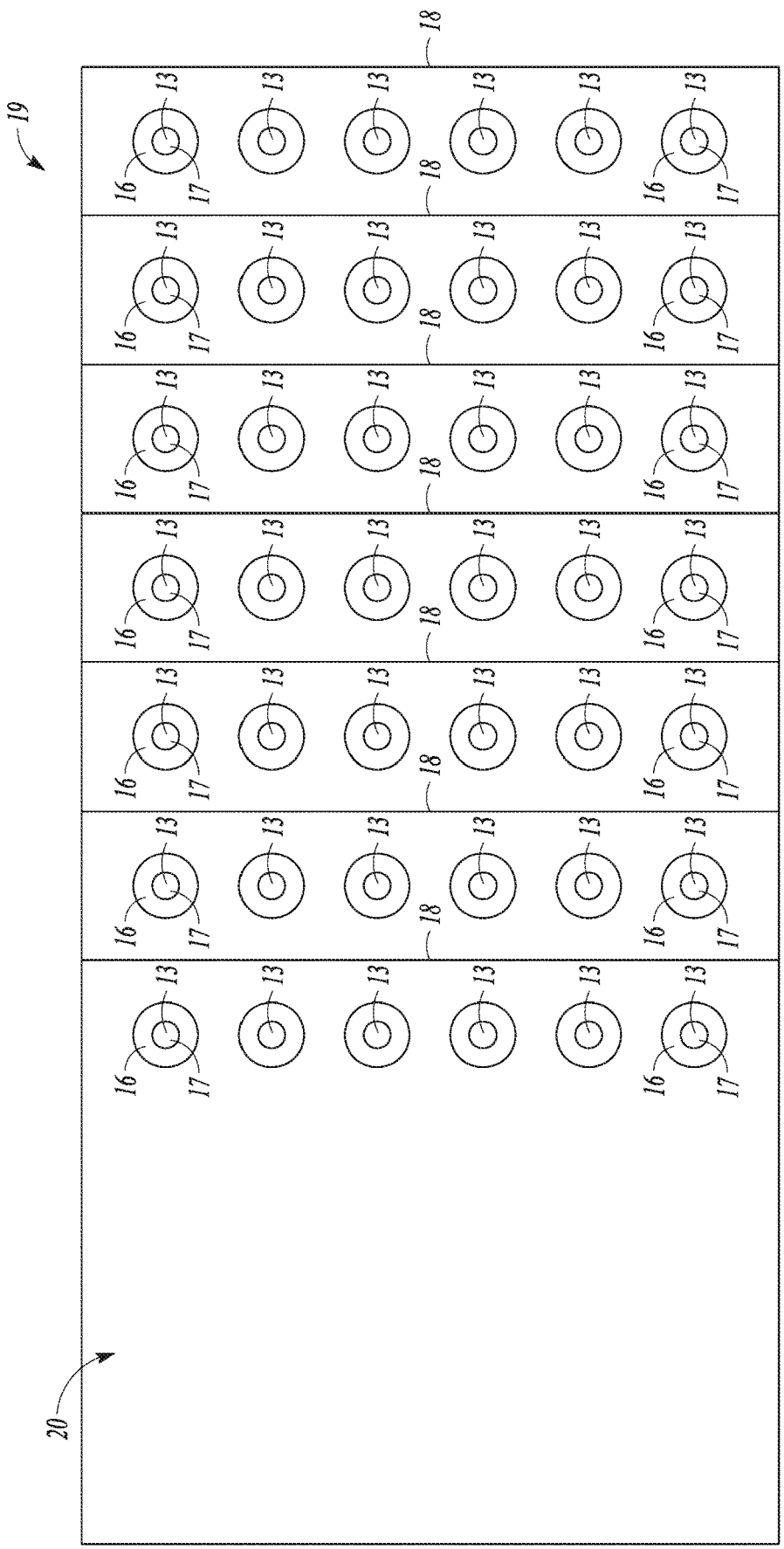
FIG. 6 is a top view of the package shown in FIG. 5.

FIG. 5 is a side view of a package 19 that includes an overlapping stack 20 of electronic assemblies 10 that are similar to the electronic assemblies 10 shown in FIGS. 2-4. FIG. 6 is a top view of the overlapping stack of electronic assemblies 10 shown in FIG. 5.

The package 19 shown in FIGS. 5 and 6 includes a stack 20 of electronic assemblies 10 where each electronic assembly 10 includes a die 11 having an upper surface 12 and a plurality of conductive columns 13 extending from the upper surface 12 such that each conductive column 13 in the stack 20 is not surrounded by any material other than where the conductive column 13 engages the respective die 11. The stack 20 of electronic assemblies 10 is arranged in an overlapping configuration such the plurality of conductive columns 13 on each electronic assembly 10 are not covered by another electronic assembly 10.

In the overlapping stack of electronic assemblies 10 shown in FIGS. 5 and 6, the plurality of conductive columns 13 in each electronic assembly 10 are aligned in a row near one edge of the respective die 11 that includes the corresponding plurality of conductive columns 13. This configuration of the plurality of conductive columns 13 in each electronic assembly 10 allows the stack 20 of electronic assemblies 10 to be arranged in a shingles configuration. It should be noted that the manner in which the electronic assemblies 10 overlap to form a stack 20 of electronic assemblies 10 will depend in part on how plurality of conductive columns 13 are configured on each respective die 11.

The conductive columns 13 that extend from each die 11 may have same or different aspect ratios. In addition, there may be a different number of conductive columns 13 in each electronic assembly 10 that forms the electronic package 19. It should be noted that the dies 11 in each electronic assembly 10 of the electronic package 1 may be the same, or have a different size, thickness, material or function.

Figure 7:
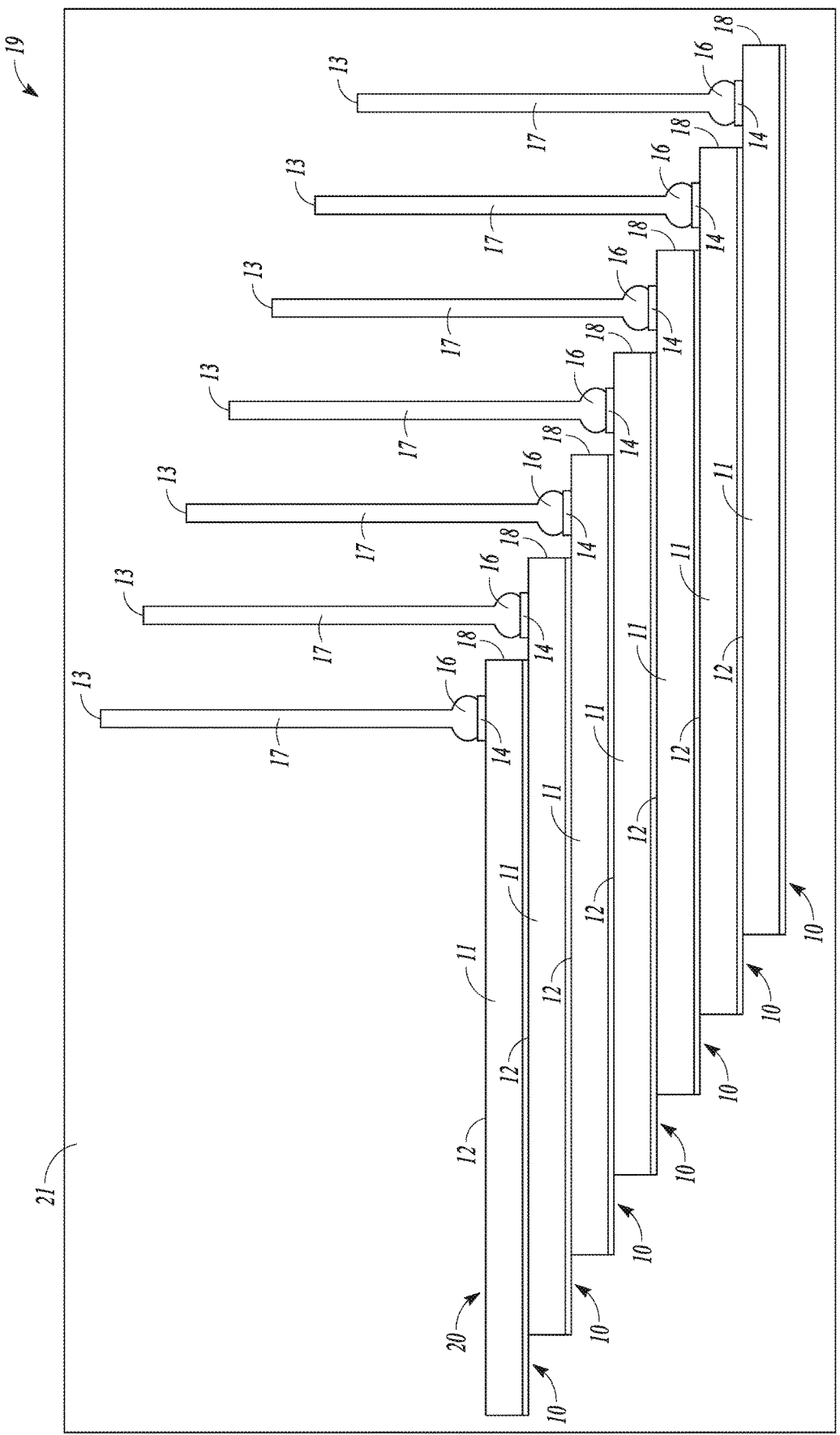
FIG. 7 is a side view of package shown in FIGS. 5 and 6 where the overlapping stack of dies is enclosed in a mold.

FIG. 7 is a side view of the overlapping stack 20 of dies 11 shown in FIGS. 5 and 6 where the package 19 is enclosed in a mold 21. As an example, the mold 21 may surround the package 19 and be formed of a thermoset molding compound, such as an epoxy (among other types of materials). In some forms of the electronic package 19 a bottom surface of the bottom die 11 in the overlapping stack 20 of electronic assemblies 10 may be exposed (or not exposed as shown in FIG. 7)

Figure 8:
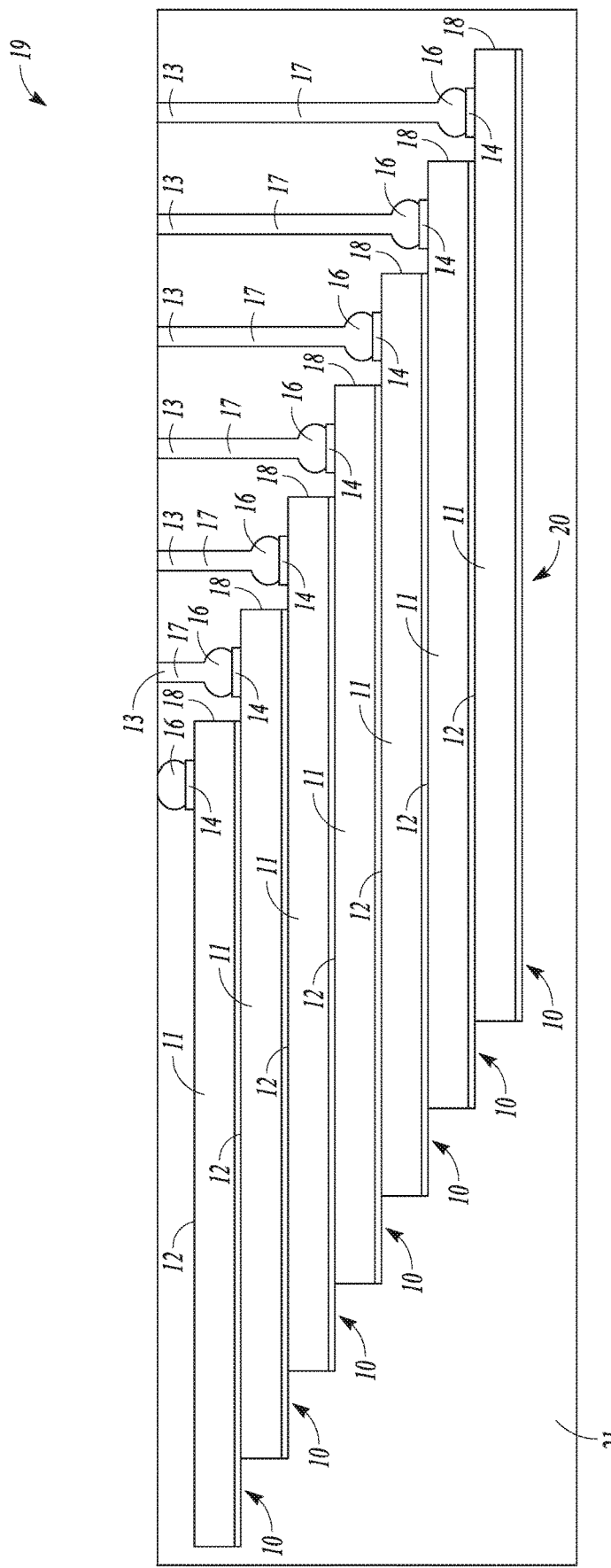
FIG. 8 is a side view of the package shown in FIG. 7 where a portion of the mold has been removed to expose the columns on overlapping stack of dies.

FIG. 8 is a side view of the overlapping stack 20 of electronic assemblies 10 shown in FIG. 7 where a portion of the mold 21 has been removed to expose the plurality of conductive columns 13 on the electronic package 19. As an example, the portion of the mold 21 may be removed by grinding, although it should be noted that other material removal methods are contemplated. It should be noted that other forms of the package 19 are contemplated where a portion of the mold 21 may be removed such that an upper surface 12 of the die 11 in the upper most electronic assembly 10 is exposed.

Figure 9:
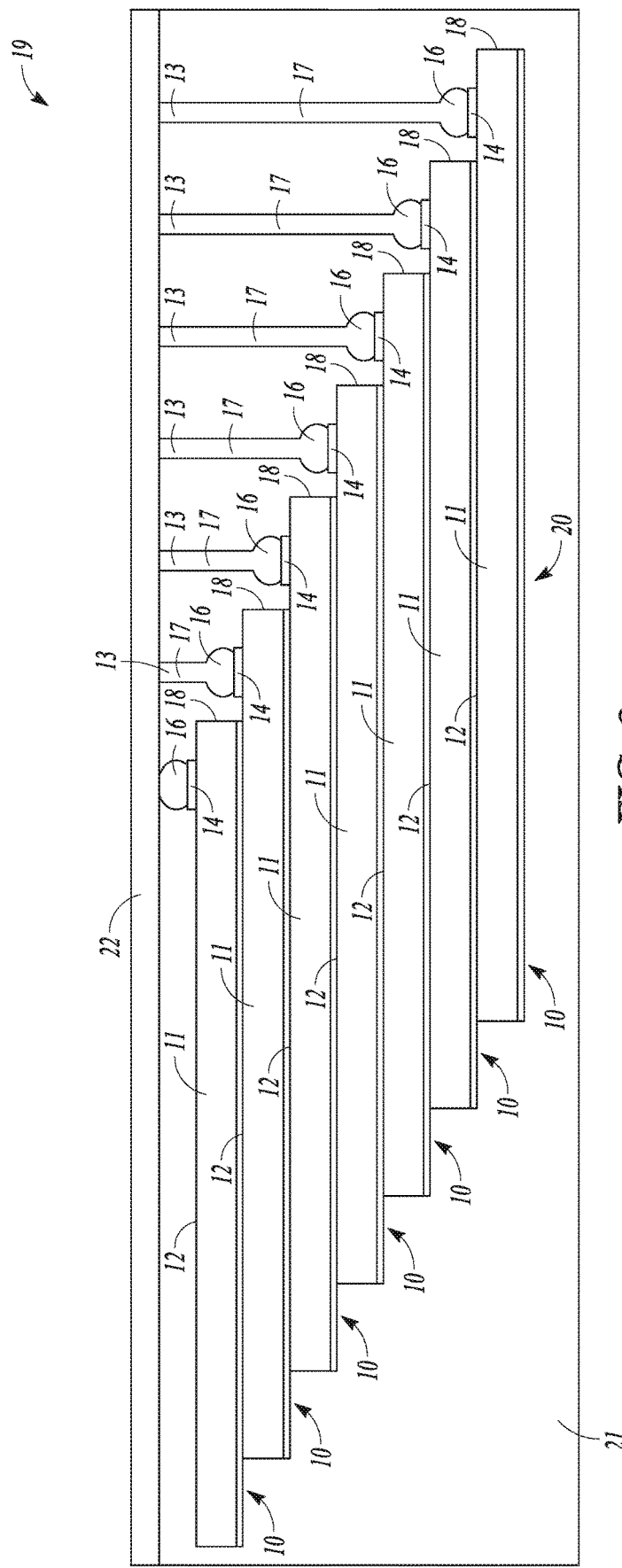
FIG. 9 is a side view of the package shown in FIG. 8 where a redistribution layer is placed on the exposed columns of the overlapping stack of dies.

FIG. 9 is a side view of the example electronic package 19 shown in FIG. 8 where a redistribution layer 22 may be placed on the exposed columns 13 in the overlapping stack 20 of electronic assemblies 10. The redistribution layer 22 may be placed on the exposed columns 13 in any manner that is known now or discovered in the future. In addition, the configuration of the redistribution layer 22 will depend in part on the locations of the exposed columns 13 in the overall design of the electronic package 19.

Figure 10:
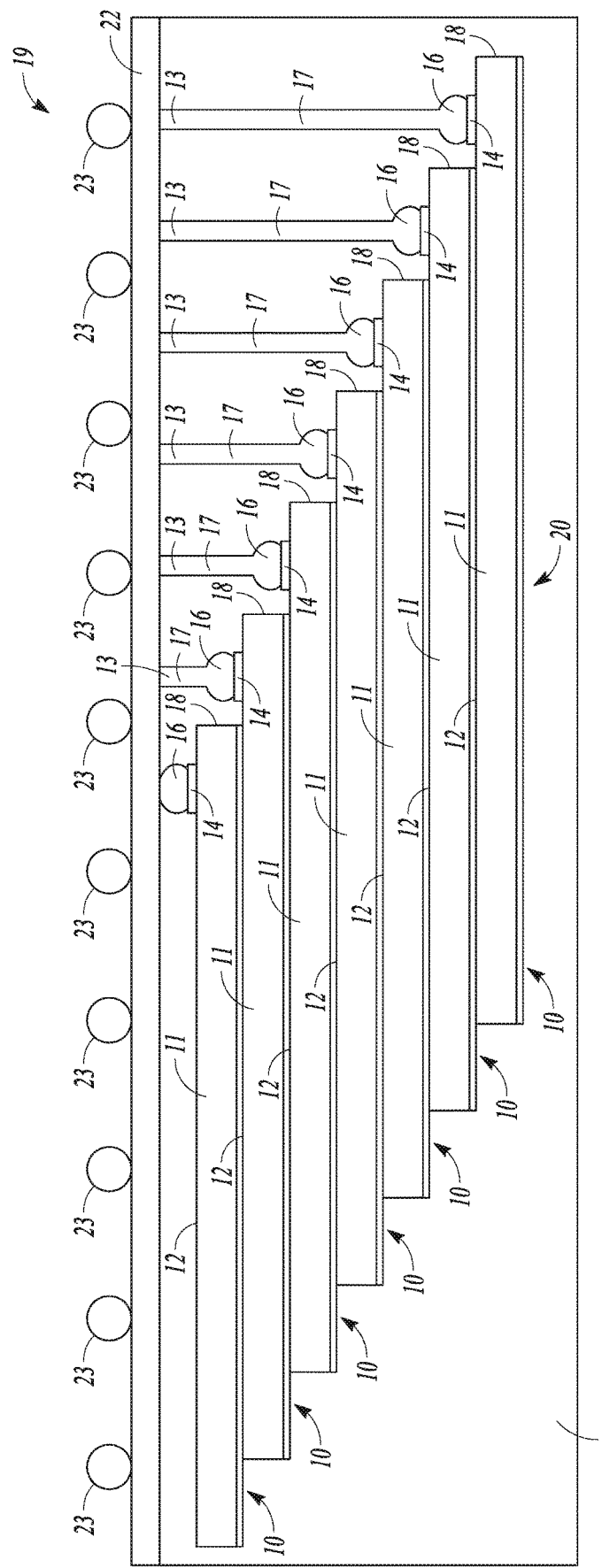
FIG. 10 is a side view of the package shown in FIG. 9 where solder bumps are placed on the redistribution layer of the overlapping stack of dies.

FIG. 10 is a side view of the electronic package 19 shown in FIG. 9 where solder bumps 23 may be placed on the conductive redistribution layer 22 on the upper surface of the mold 21 and/or the exposed portions of some of the plurality of conductive columns 13. The solder bumps 23 may be placed on the conductive redistribution layer 22 and/or the exposed columns 13 in any manner that is known now or discovered in the future. In addition, the configuration of the solder bumps 13 will depend in part on the locations of the exposed columns 13 and configuration of the redistribution layer 22 in the overall design of the package 19.

Figure 11:
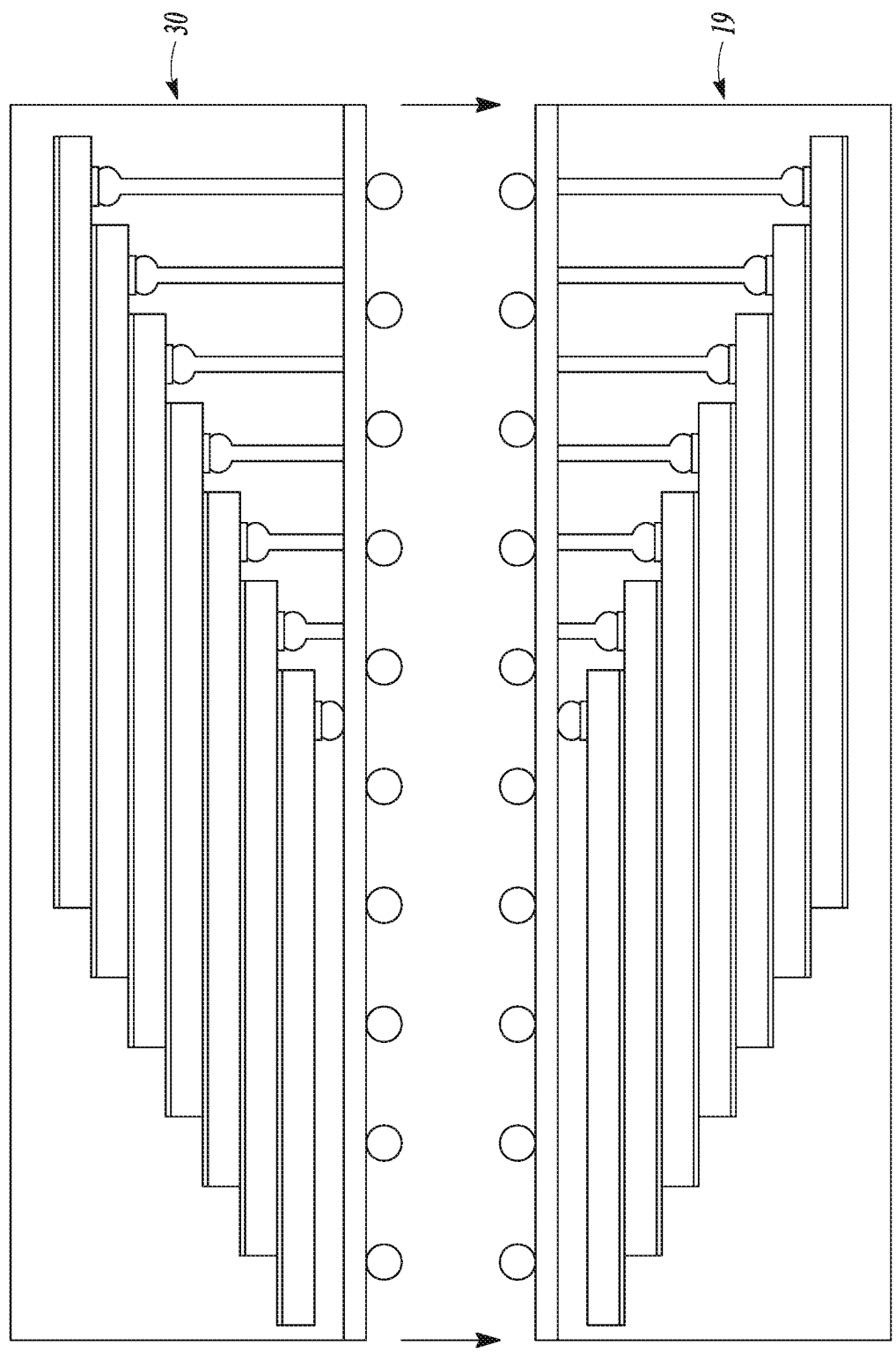
FIG. 11 is a side view of the package shown in FIG. 10 where a similar additional package is inverted and aligned with the solder balls on the package shown in FIG. 10.

FIG. 11 is a side view of the package 19 shown in FIG. 10 where a similar additional package 30 is inverted and aligned with the solder bumps 23 on the overlapping stack of dies shown in FIG. 10. It should be noted that although the package 19 is shown as being ready for assembly to a second similar additional package 30 in FIG. 11, the package 19 may be mounted using the solder bumps 23 (or some other type of conductor) to many other types of electronic devices (e.g., a substrate, die, chipset, motherboard, card and/or different type of electronic package among other types of electronic devices). In addition, the dies 11 or packages 20 may be thinned (e.g., by grinding) in order to reduce the height of the electronic assemblies 10 and/or packages 20. Example are also contemplated where an additional electronic device (e.g., another package similar to electronic package 19) is mounted to the other side of the electronic package 19 in order form a stack of multiple electronic packages.

Figure 12:
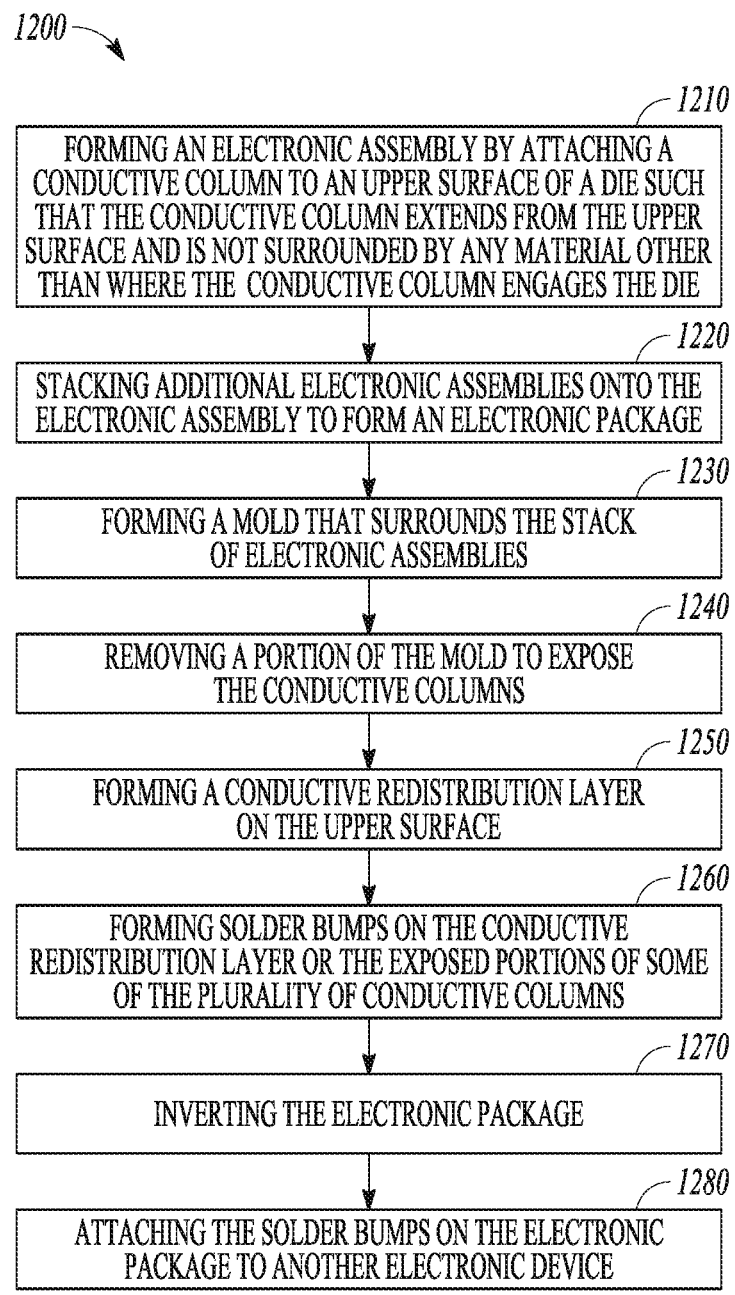
FIG. 12 is a flow diagram illustrating a method of overlapping a stack of electronic assemblies to form an electronic package.

FIG. 12 is a flow diagram illustrating an example method [1200]. The method [1200] includes [1210] forming an electronic assembly 10 by attaching a conductive column 13 to an upper surface 12 of a die 11 such that the conductive column 13 extends from the upper surface 12 and is not surrounded by any material other than where the conductive column 12 engages the die 11 (see FIGS. 2 and 3). In some forms of the method [1200], attaching a conductive column 13 to an upper surface 12 of a die 11 includes attaching a conductive column 13 to an upper surface 12 of a die 11 using wire bonding techniques, although any techniques that are known now or discovered in the future may be used to attach the conductive column 13 to the upper surface 12 of the die 11.

As shown in FIG. 4, [1210] forming an electronic assembly 10 includes attaching a plurality of conductive columns 13 to an upper surface 12 of a die 11 such that the conductive columns 13 extend from the upper surface 12 and are not surrounded by any material other than where the conductive columns 13 engage the die 11. In some forms of the method [1200], attaching a plurality of conductive columns 13 to an upper surface 12 of a die 11 includes aligning the plurality of conductive columns 13 in a row near one edge 18 of the die 11.

As shown in FIGS. 5 and 6, the method [1200] may further include [1220] stacking additional electronic assemblies 10 onto the electronic assembly 10 to form an electronic package 19. Each additional electronic assembly 10 includes a die 11 having an upper surface 12 and a plurality of conductive columns 13 extending from the upper surface 12 such that each conductive column 13 is not surrounded by any material other than where the conductive columns 13 engage the respective dies 11. The electronic assemblies 10 that form the package 19 are arranged in an overlapping configuration such the plurality of conductive columns 13 on each electronic assembly 10 are not covered by another electronic assembly 10.

The method [1200] may further include [1230] forming a mold 21 that surrounds the stack 20 of electronic assemblies 10 (see FIG. 7). In addition, the method [1220] may include [1240] removing a portion of the mold 21 to expose the conductive columns 13 through an upper surface of the mold 21 (see FIG. 8).

As shown in FIG. 9, the method [1200] may further include [1250] forming a conductive redistribution layer 22 on the upper surface of the mold 21. In some forms of the method [1200] the conductive redistribution layer 22 may engage an exposed portion of each of the plurality of conductive columns 13. The method may also include [1260] forming solder bumps 23 on the conductive redistribution layer 22 or the exposed portions of some of the plurality of conductive columns 13 (see FIG. 10).

Depending on the application where the package 19 is to be used, the method [1200] may further include [1270] inverting the electronic package, and [1280] attaching the solder bumps 23 on the electronic package 19 to another electronic device (see, e.g., package 30 in FIG. 11). The type of electronic device that the package 19 is attached to will depend in part on the desired functionality of the package 19 when the package 19 is used in a particular application.

It should be noted that while many of the electronic assemblies 10 and packages 19 are shown as being in singulated form, the methods, electronic assemblies 10 and packages 19 described herein may be in wafer form, row form or any other form that promotes fabrication of the electronic assemblies 10 and overlapping stacks 20 of electronic assemblies 10. The form taken by the methods, electronic assemblies 10 and packages 19 will depend in part on manufacturing costs as well as the overall desired functionality of the electronic assemblies 10 and packages 19.

Figure 13:
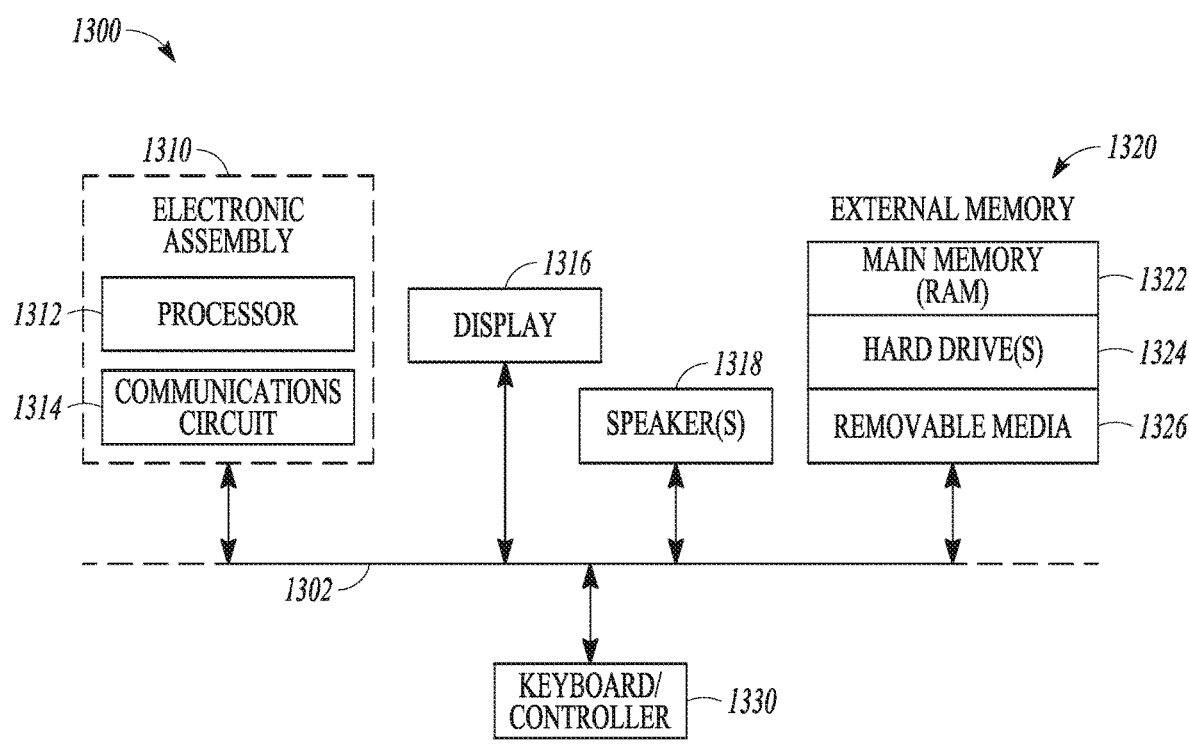
FIG. 13 is block diagram of an electronic apparatus that includes the electronic assemblies and/or the electronic packages described herein.

FIG. 13 is a block diagram of an electronic apparatus 1300 incorporating at least one electronic assembly 10 and or electronic package 19 described herein. Electronic apparatus 1300 is merely one example of an electronic apparatus in which forms of the electronic assemblies 10, electronic packages 19 described herein may be used. Examples of an electronic apparatus 1300 include, but are not limited to, personal computers, tablet computers, mobile telephones, game devices, MP3 or other digital music players, etc. In this example, electronic apparatus 1300 comprises a data processing system that includes a system bus 1302 to couple the various components of the electronic apparatus 1300. System bus 1302 provides communications links among the various components of the electronic apparatus 1300 and may be implemented as a single bus, as a combination of busses, or in any other suitable manner.

An electronic apparatus 1300 as describe herein may be coupled to system bus 1302. The electronic apparatus 1300 may include any circuit or combination of circuits. In one embodiment, the electronic apparatus 1300 includes a processor 1312 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic apparatus 1300 are a custom circuit, an application-specific integrated circuit (ASIC), or the like, such as, for example, one or more circuits (such as a communications circuit 1314) for use in wireless devices like mobile telephones, tablet computers, laptop computers, two-way radios, and similar electronic systems. The IC can perform any other type of function.

The electronic apparatus 1300 may also include an external memory 1320, which in turn may include one or more memory elements suitable to the particular application, such as a main memory 1322 in the form of random access memory (RAM), one or more hard drives 1324, and/or one or more drives that handle removable media 1326 such as compact disks (CD), flash memory cards, digital video disk (DVD), and the like.

The electronic apparatus 1300 may also include a display device 1316, one or more speakers 1318, and a keyboard and/or controller 1330, which can include a mouse, trackball, touch screen, voice-recognition device, or any other device that permits a system user to input information into and receive information from the electronic apparatus 1300.

Figure 14:
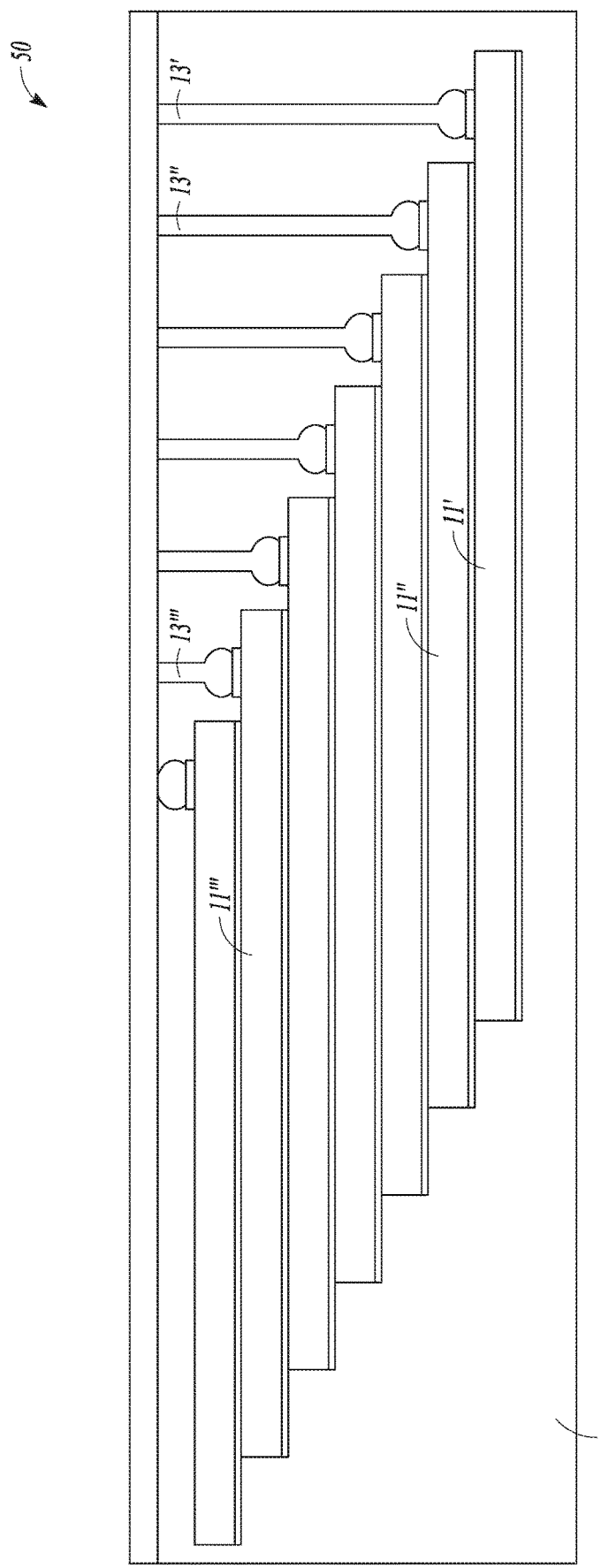
FIG. 14 is a side view of another electronic apparatus.

FIG. 14 illustrates an example apparatus 50 that includes a first die 11' and a first conductive column 17' on a surface of the first die 11'. A second die 11" is disposed adjacent the first die 11' and a second conductive column 17" is on a surface of the second die 11".

A mold material 21 contacts the first die 11' and the second die 11" at each respective surface, and at each respective first conductive column 17' and second conductive column 17". The mold material 21 exhibits characteristic flow across each of the first conductive column 17' and the second conductive column 17", and wherein the mold material is integral.

In some example forms of the apparatus 50, the apparatus 50 further includes a subsequent die 11''' and a subsequent conductive column 17''' on a surface of the subsequent die 11'''. The mold material 21 also exhibits characteristic residual flow across the subsequent conductive column 17'''.

Conventional techniques for forming conducting columns typically include drilling through a mold material to reach a die, and subsequently filling in the drilled hole with conductive material to form the conductive column. Configurations that are formed by flowing a mold material around already existing conducting columns will exhibit distinctive physical characteristics that are detectable and different from configurations formed by drilling and filling after the fact. Examples of such physical differences include, but are not limited to microstructural differences in a mold polymer or other material that is bent around the conductive column as a residual artifact from the flow.

One other example physical difference includes flow marks and weld lines in the mold 21. Weld lines represent an optical as well as mechanical defect in a molded part. Weld lines typically appear in the area where the polymer flows come together during the injection process.

Another example physical difference includes grooves. Grooves are a surface defect where "rings" appear at the surface of molded parts mainly around pin point gates and concentrically spreading over the molding. Jetting is a similar defect to grooves where rough or matte lines appear at the surface of the molding starting at the gate and spreading over the entire part.

Another example physical difference includes air streaks. Air streaks in molded parts appear as matte, silvery or white lines (streaks) at the surface of the molded parts. They can usually be found near domes, ribs and where the wall thickness of the molded part may vary. They also can appear near the sprue or near engraving and depressions.

To better illustrate the electronic assemblies, electronic packages and methods disclosed herein, a non-limiting list of examples is provided herein:

Example 1 includes an electronic assembly that includes a die that includes an upper surface and a conductive column extending from the upper surface such that the conductive column is not surrounded by any material other than where the conductive column engages the die.

Example 2 includes the electronic assembly of example 1, wherein the die includes a conductive pad such that the conductive column extends from the conductive pad on the die.

Example 3 includes the electronic assembly of any one of examples 1-2, wherein the conductive column includes a spherical section that engages the conductive pad and a cylindrical section that extends from the spherical section.

Example 4 includes the electronic assembly of any one of examples 1-3, wherein conductive column is part of a plurality of conductive columns extending from the upper surface such that the conductive columns are not surrounded by any material other than where the conductive columns engage the die.

Example 5 includes the electronic assembly of any one of examples 1-4, wherein the plurality of conductive columns are aligned in a row near one edge of the die.

Example 6 includes an electronic package that includes a stack of electronic assemblies where each electronic assembly includes a die that having an upper surface and a plurality of conductive columns extending from the upper surface such that each conductive column is not surrounded by any material other than where the conductive column engages the die, and wherein the stack of electronic assemblies is arranged in an overlapping configuration such the plurality of conductive columns on each electronic assembly are not covered by another electronic assembly.

Example 7 includes the electronic package of example 6, wherein the plurality of conductive columns in each electronic assembly are aligned in a row near one edge of the respective die that includes the corresponding plurality of conductive columns.

Example 8 includes the electronic package of any one of examples 6-7, and further including a mold that surrounds the stack of electronic assemblies.

Example 9 includes the electronic package of any one of examples 6-8, wherein a portion of the mold is removed to expose the conductive columns through an upper surface of the mold.

Example 10 includes the electronic package of any one of examples 6-9, and further including a conductive redistribution layer on the upper surface of the mold, the conductive redistribution layer engaging an exposed portion of each of the plurality of conductive columns.

Example 11 includes the electronic package of any one of examples 6-10, and further including solder bumps that engage the conductive redistribution layer on the upper surface of the mold or the exposed portions of some of the plurality of conductive columns.

Example 12 includes the electronic package of any one of examples 6-11, and further including an additional electronic package that is inverted and joined with the electronic package by connecting solder bumps on the electronic package with solder bumps on the additional electronic package.

Example 13 is a method that includes forming an electronic assembly by attaching a conductive column to an upper surface of a die such that the conductive column extends from the upper surface and is not surrounded by any material other than where the conductive column engages the die.

Example 14 includes the method of example 13, wherein attaching a conductive column to an upper surface of a die includes attaching a conductive column to an upper surface of a die using wire bonding techniques.

Example 15 includes the method of any one of examples 13-14, wherein forming an electronic assembly includes attaching a plurality of conductive columns to an upper surface of a die such that the conductive columns extend from the upper surface and are not surrounded by any material other than where the conductive columns engage the die.

Example 16 includes the method of any one of examples 13-15, wherein attaching a plurality of conductive columns to an upper surface of a die includes aligning the plurality of conductive columns in a row near one edge of the die.

Example 17 includes the method of any one of examples 13-16, and further including stacking additional electronic assemblies onto the electronic assembly to form an electronic package, wherein each additional electronic assembly includes a die having an upper surface and a plurality of conductive columns extending from the upper surface such that each conductive column is not surrounded by any material other than where the conductive column engages the respective die, and wherein the electronic assemblies are arranged in an overlapping configuration such the plurality of conductive columns on each electronic assembly are not covered by another electronic assembly.

Example 18 includes the method of examples 13-17, and further including forming a mold that surrounds the stack of electronic assemblies.

Example 19 includes the method of any one of examples 13-18, and further including removing a portion of the mold to expose the conductive columns through an upper surface of the mold.

Example 20 includes the method of examples 13-19, and further including forming a conductive redistribution layer on the upper surface of the mold, wherein the conductive redistribution layer engages an exposed portion of each of the plurality of conductive columns, and forming solder bumps on the conductive redistribution layer or the exposed portions of some of the plurality of conductive columns.

Example 21 includes the method of any one of examples 13-20, and further including inverting the electronic package, and attaching the solder bumps on the electronic package to another electronic device.

Example 22 includes an example apparatus that includes a first die and a first conductive column on a surface of the first die. A second die is disposed adjacent the first die and a second conductive column is on a surface of the second die. A mold material contacts the first die and the second die at each respective surface, and at each respective first conductive column and second conductive column. The mold material exhibits characteristic flow across each of the first conductive column and the second conductive column, and wherein the mold material is integral.

Example 23 includes the apparatus of Example 22, and further includes a subsequent die and a subsequent conductive column on a surface of the subsequent die. The mold material also exhibits characteristic residual flow across the subsequent conductive column.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic package, comprising:
   a stack of electronic assemblies where each electronic assembly includes a die having an upper surface and a plurality of conductive columns extending from the upper surface;
   wherein the stack of electronic assemblies is arranged in a stepped overlapping configuration such the plurality of conductive columns that extend from the upper surface of each die on each electronic assembly are not covered by another electronic assembly, wherein each of the dies in each of the electronic assemblies includes conductive pads such that the plurality of conductive columns extends from the conductive pads on the dies, wherein each of the conductive columns includes a spherical section that engages one of the conductive pads and a cylindrical section that extends from the spherical section; and
   a mold that surrounds the stack of electronic assemblies, the conductive columns being exposed through an upper surface of the mold.

2. The electronic package of claim 1, wherein the plurality of conductive columns in each electronic assembly are aligned in a row near one edge of the respective die that includes the corresponding plurality of conductive columns.

3. The electronic package of claim 1, further comprising a conductive redistribution layer on the upper surface of the mold, the conductive redistribution layer engaging an exposed portion of each of the plurality of conductive columns.

4. The electronic package of claim 3, further comprising solder bumps that engage the conductive redistribution layer on the upper surface of the mold or the exposed portions of some of the plurality of conductive columns.

5. The electronic package of claim 4, further comprising an additional electronic package that is inverted and joined with the electronic package by connecting solder bumps on the electronic package with solder bumps on the additional electronic package.

6. The electronic package of claim 1, wherein plurality of the conductive columns in each of the electronic assemblies have the same length.

* * * * *